United States Patent
Wu et al.

(10) Patent No.: US 6,859,360 B2
(45) Date of Patent: Feb. 22, 2005

(54) EXTENSION DEVICE FOR DISPLAY

(76) Inventors: Wei Chung Wu, P.O. Box 82-114, Taipei (TW); Hwang Ping Lin, P.O. Box 82-144, Taipei (TW)

( * ) Notice: Subject to any disclaimer, the term of this patent is extended or adjusted under 35 U.S.C. 154(b) by 117 days.

(21) Appl. No.: 10/426,860

(22) Filed: May 1, 2003

(65) Prior Publication Data

US 2004/0165343 A1 Aug. 26, 2004

(30) Foreign Application Priority Data

Feb. 21, 2003 (TW) ................................ 92202772 U

(51) Int. Cl.⁷ .............................................. G06F 1/16
(52) U.S. Cl. ................... 361/683; D14/115; 345/167; 364/708.1
(58) Field of Search ............................... 361/674–687, 361/724–727; 345/163–167, 905, 161; 364/708.1, 709.11; 400/691

(56) References Cited

U.S. PATENT DOCUMENTS 6,205,021 B1 * 3/2001 Klein et al. ................. 361/683
6,490,155 B2 * 12/2002 Han et al. ................... 361/686
6,550,910 B2 * 4/2003 Hwang ....................... 347/108

\* cited by examiner

*Primary Examiner*—Hung Van Duong
(74) *Attorney, Agent, or Firm*—Leong C. Lei

(57) ABSTRACT

An extension device for display is disclosed. The extension device includes a housing mounted at the rear side of the display; an insertion slot disposed on the housing, the bottom end of the insertion slot connected to a connection section and the other end of the insertion slot being formed into an opening; a positioning device including an apex region and a valley region; and an extension box adapted within the insertion slot, one end of the extension box being a connection section, and the extension box being connected to the connection section by means of the positioning device and the bottom end of the insertion slot, the other end of the extension box being provided with an input terminal for external signals.

6 Claims, 6 Drawing Sheets

EXTENSION DEVICE FOR DISPLAY

BACKGROUND OF THE INVENTION (a) Technical Field of the Invention

The present invention relates to an extension device for display. More particularly, an extension device which can be rapidly assembled and disassembled from a display.

(b) Description of the Prior Art

Displays are commonly used at home; in particular, the displays are employed in TV or computer. As technology is upgraded and advanced, it is more economical to have the display used in both TV and computer, or other usages needing a monitor. In order to solve the drawback, Taiwanese Patent Publication No. 322538 discloses an extension structure used in a display. However, the drawbacks in this structure are as follows:

(1) The Installation of a TV Card is Not Convenient

The opening of the conventional extension box faces the rear of the display and therefore, the display has to be directed to the user in order to install or to disassemble the TV signal card so as to facilitate the necessary procedures. The installation and/or the disassemble process is very inconvenient.

(2) The Operation is Laborious

When the display is to be used for computer, the TV signal card has to be separated so as to avoid in appropriate contact at the insertion slot which will damage the display. It is very laborious in operating the installation of the signal card to the display.

(3) The Volume of the Display is Increased

The rear of the display is provided with an appropriate space for the mounting of the extension box. Due to the mounting of the extension box, the volume of the display is increased and the display occupies space.

Accordingly, it is an object of the present invention to provide an extension device for display which mitigates the above-drawbacks.

SUMMARY OF THE INVENTION

Accordingly, it is an object of the present invention to provide a display extension structure comprising a housing mounted at the rear side of the display; an insertion slot disposed on the housing, the bottom end of the insertion slot connected to a connection section and the other end of the insertion slot being formed into an opening; a positioning device including an apex region and a valley region; and an extension box adapted within the insertion slot, one end of the extension box being a connection section, and the extension box being connected to the connection section by means of the positioning device and the bottom end of the insertion slot, the other end of the extension box being provided with an input terminal for external signals.

Still a further object of the present invention to provide a display extension structure, wherein the housing includes a sliding slot having one end being an opening, and the walls of the slot are provided with a plurality of positioning ribs spaced apart.

Yet another object of the present invention to provide a display extension structure, wherein the positioning device includes an apex region and a valley region which allows two stages of urging of the extension box.

Another object of the present invention to a display extension structure, wherein the extension box is a 2 mm thick anti-magnetic wave metallic box having a volume larger than that of the positioning device in the insertion slot so that the passed through positioning device can be urged or restored.

A further object of the present invention to provide a display extension structure, wherein the external housing of the extension box includes an upper housing and a lower housing mounted to each other, and an elastic engaging section includes a protruded plate and a bending plate and the protruded plate is a plate body formed from the side of the upper housing directly pushed outward to become an arch-shaped, and the protruded plate and the bending plate are stacked, and the bottom side face is mounted with a plurality of anti-sliding stripes, enhancing frictional force of sliding when the extension box is within the guiding slot.

Still a further object of the present invention to provide a display extension structure, wherein the housing is provided with a sliding slot, and a cover body is positioned on the top of the sliding slot, and one side of the cover body is provided with a plurality of protruded blocks for engagement with the engaging hole, and the other side of the cover body is a U-shaped fastening plate having a top end being exposed in the recess and the other side of the elastic fastener is an engaging block for engagement within the engaging slot.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

Figure 1:
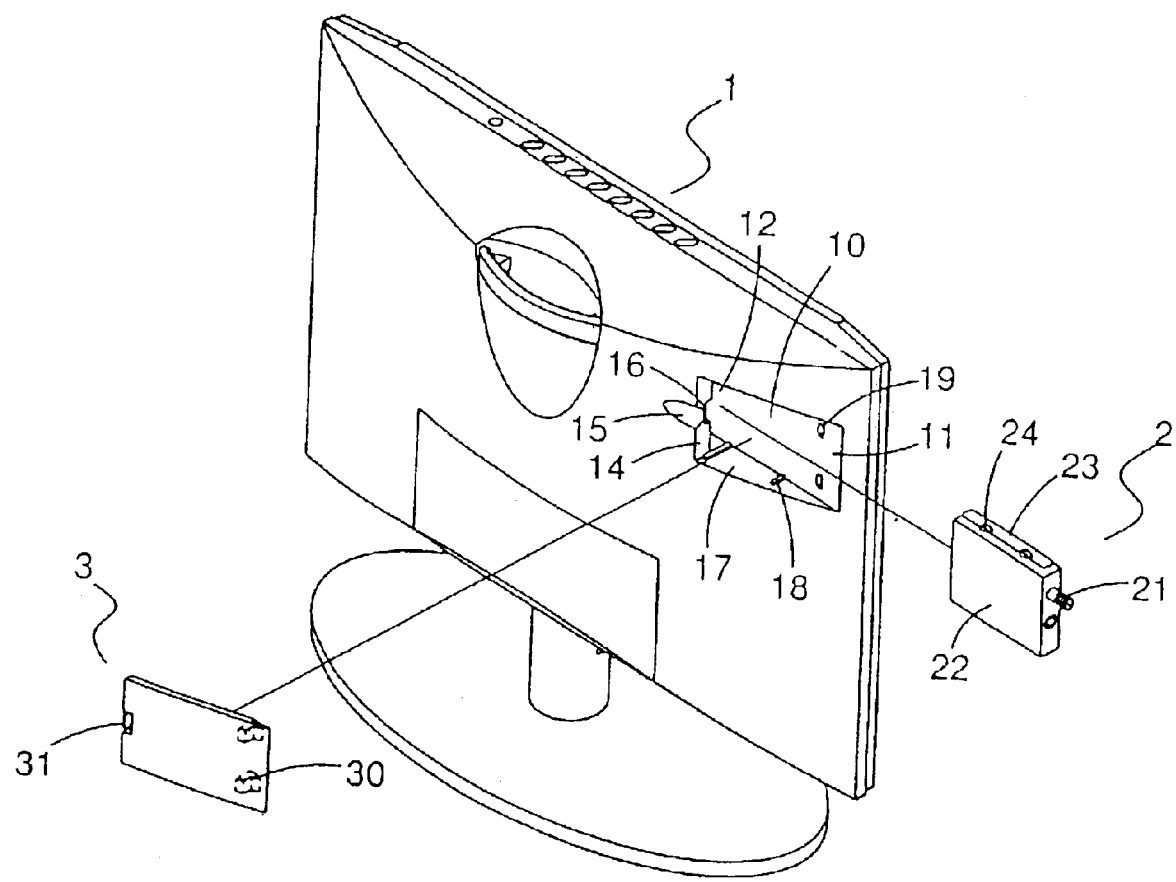
FIG. 1 is an exploded perspective view of the present invention.
Figure 2:
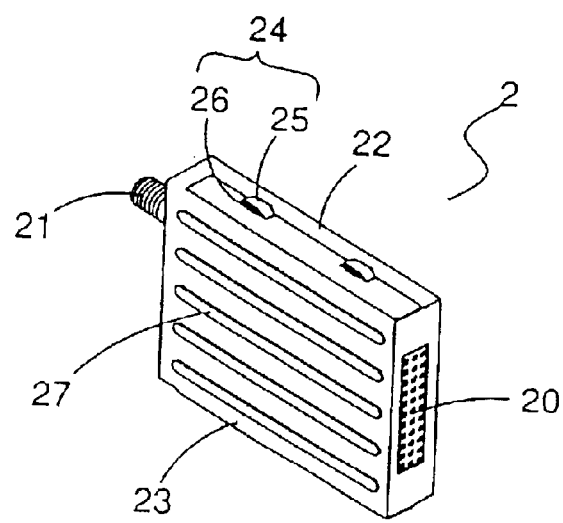
FIG. 2 is a perspective view of one side of the extension box of the present invention.
Figure 3:
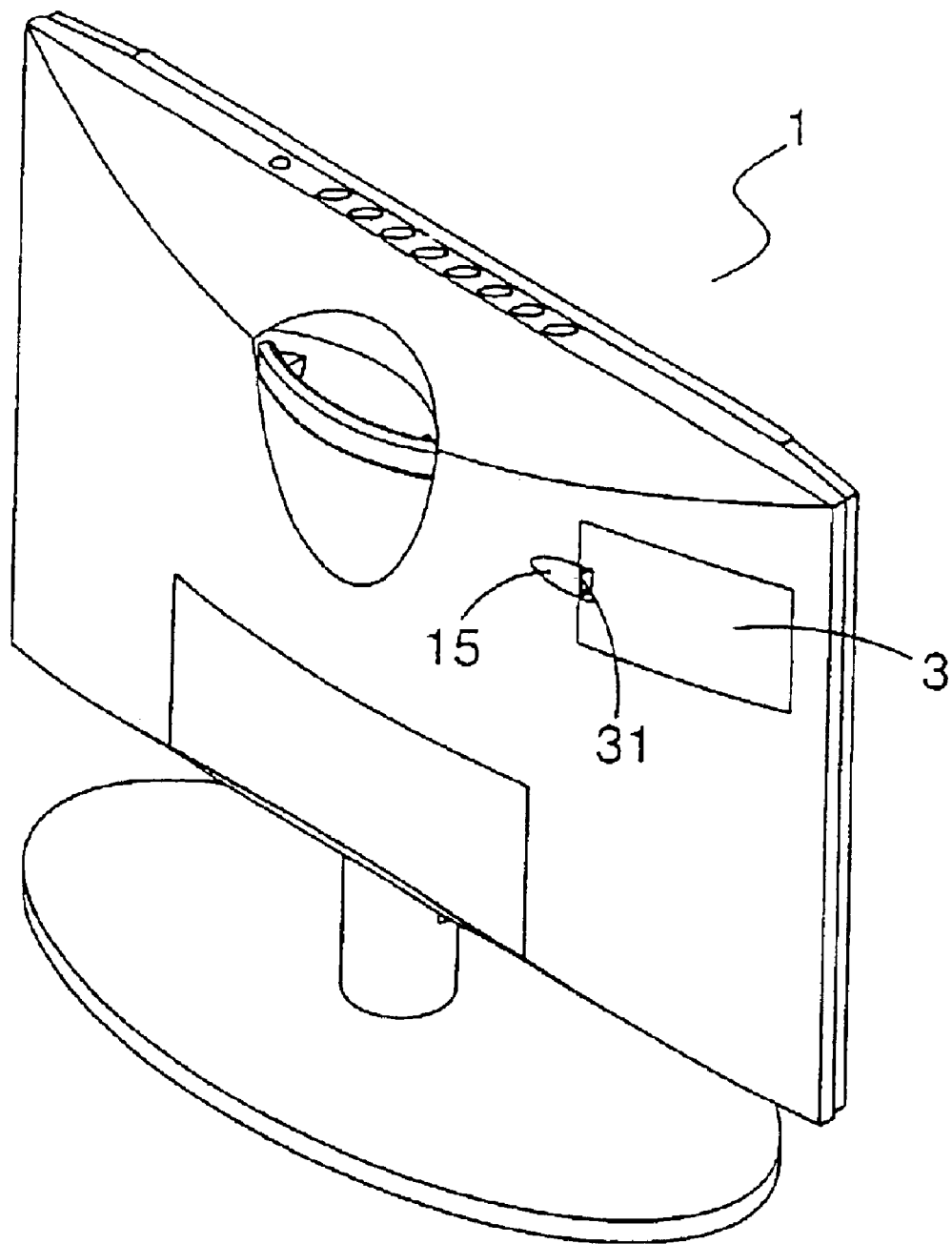
FIG. 3 is a perspective view of the present invention.

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Referring to FIGS. 1 to 5 and 8 of the present invention, there is shown a display extension structure comprising a display 1 with a sliding slot 10 at the rear side thereof and one end of the sliding slot 10 extended to the side edge of the display 1 to form an opening 11. The other end of the sliding slot 10 is extended to the interior of the display 1 to form an insertion slot 12. A positioning device 121 includes an apex section 121a and a valley section 121b is located at one side of the sliding slot 10 for guiding an extension box of the display to be mounted to the insertion slot of the housing in two stages. The bottom section of the insertion slot 12 is a connection section 13 and the top opening of the insertion slot 12 is an open face 14. The upper and lower edges of the open face 14 are respectively provided with a recess 15 and an engaging slot 16. The two lateral walls 17 of the sliding slot 10 are provided a plurality of positioning ribs 18 spaced apart, and the sliding slot 10 is provided with a plurality of engaging holes 19.

An extension box 2 has one side mounted with a connection section 20 for insertion with an inserting connection section 13 and a corresponding side is provided with an aerial connector 21 and a S-terminal, TV cable or other wire connection. The housing of the extension box 2 includes an upper housing 22 and a lower housing 23. The two sides of the housing are provided with a plurality of elastic engaging sections 24 with elasticity. The elastic engaging section 24 includes a protruded plate 25 and a bending plate 26. The protruded plate 25 is a plate body directly bending from the side of the upper housing 22 to form an arch-shaped structure. The bending plate 26 is a L-shaped body formed from the side of the lower housing 23, and the protruded plate 25 and the bending plate 26 are stacked. The bottom side face of the lower housing 23 is provided with a plurality of anti-sliding stripes 27 to enhance the sliding friction of the extension box 2 within the sliding slot 10.

The cover body 3 is located at the upper section of the sliding slot 10, and one side of the cover body 3 is provided with a plurality of protruded blocks 30 for engagement with the engaging slot 19. The other side of the cover body 3 is provided with a U-shaped elastic fastening plate 31. The upper end of the fastening plate 31 is exposed within the recess 15. The other side of the fastening plate 31 is disposed with an engaging block 32 which can be engaged with the engaging slot 16. To open the cover body 3, the fastening plate 31 is slightly pressed and the engaging block 32 on the fastening plate 31 is released from the engaging slot 16, and the cover body 31 is flip opened.

Figure 4:
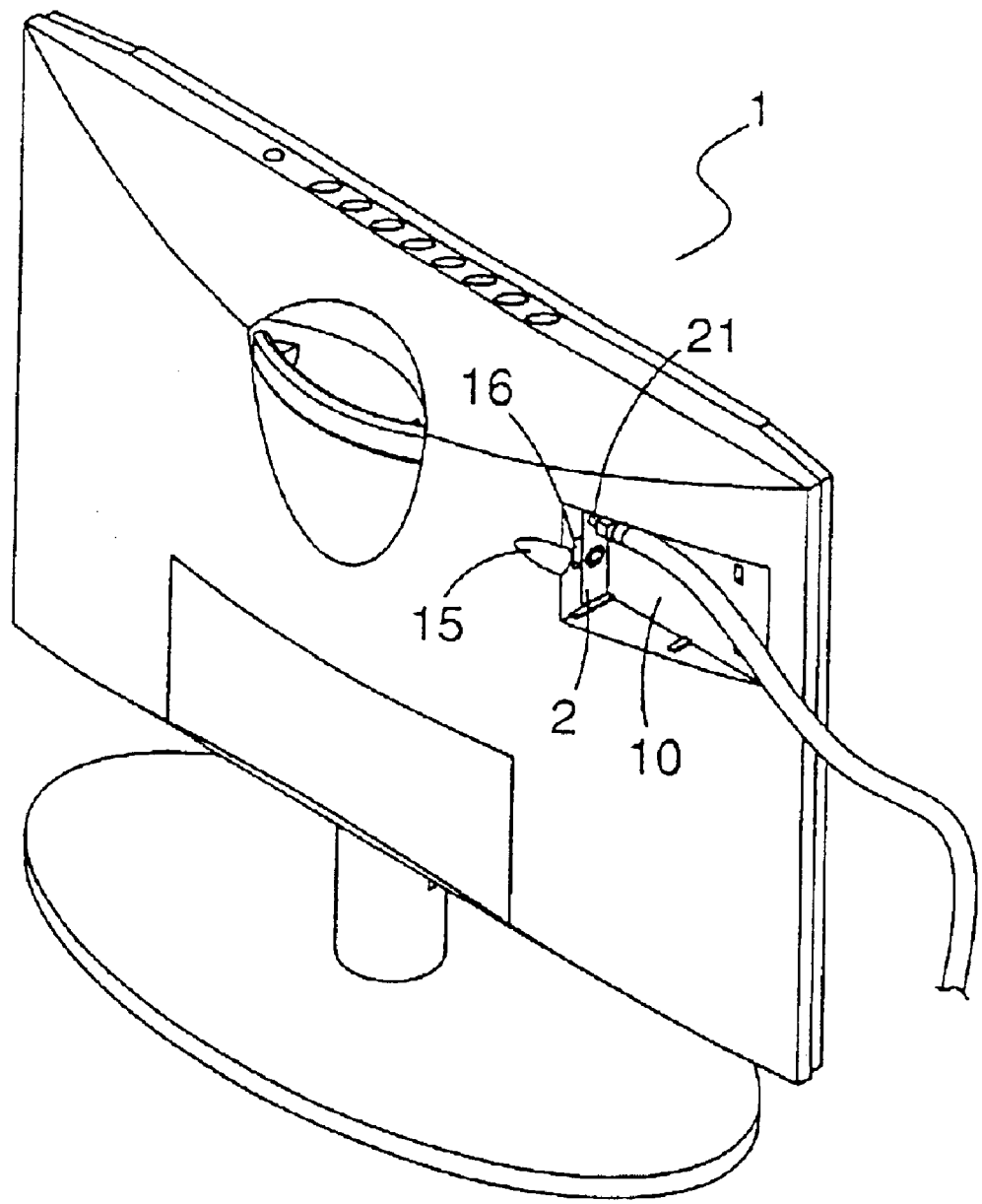
FIG. 4 is a schematic view of the present invention.
Figure 5:
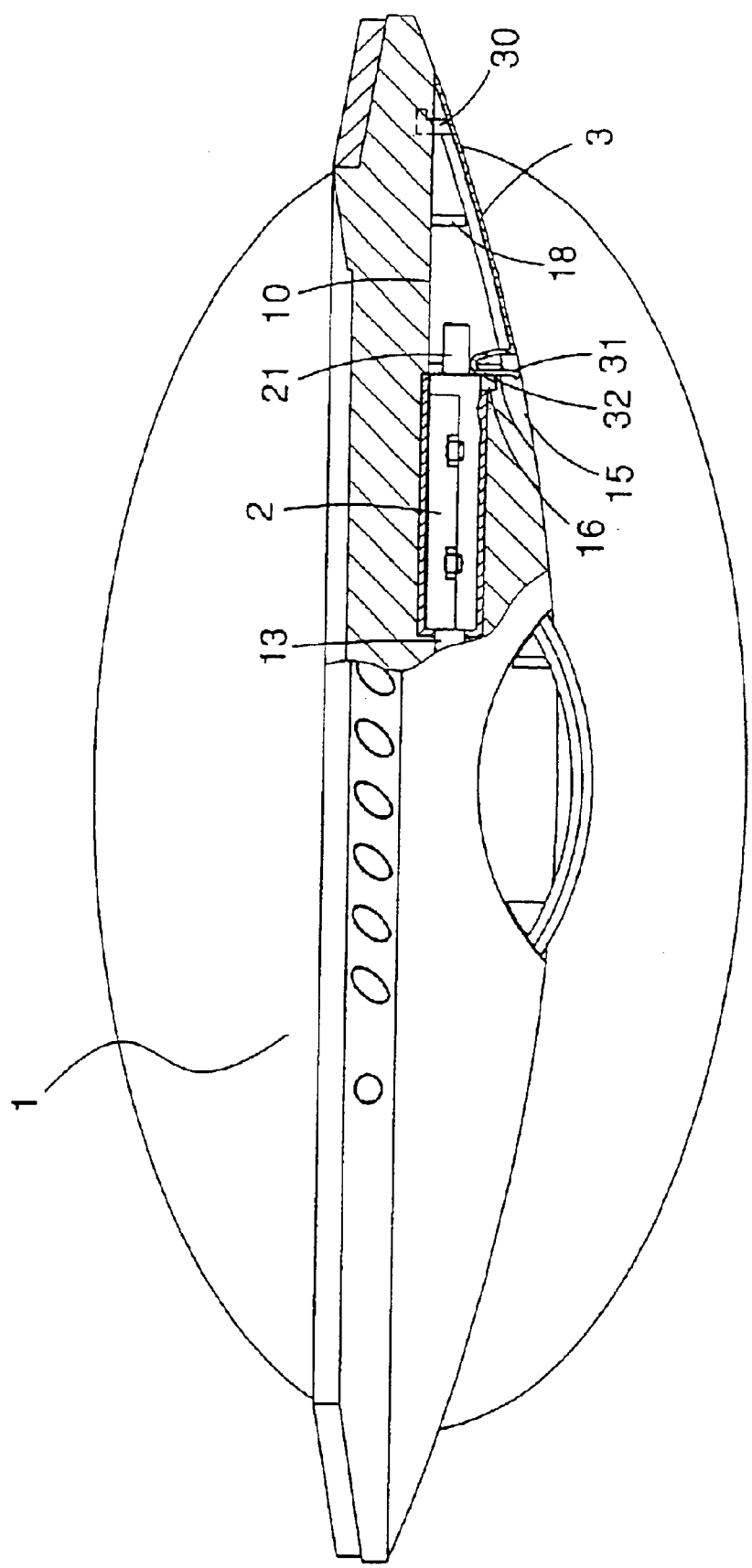
FIG. 5 is a partial sectional view of the present invention.
Figure 6:
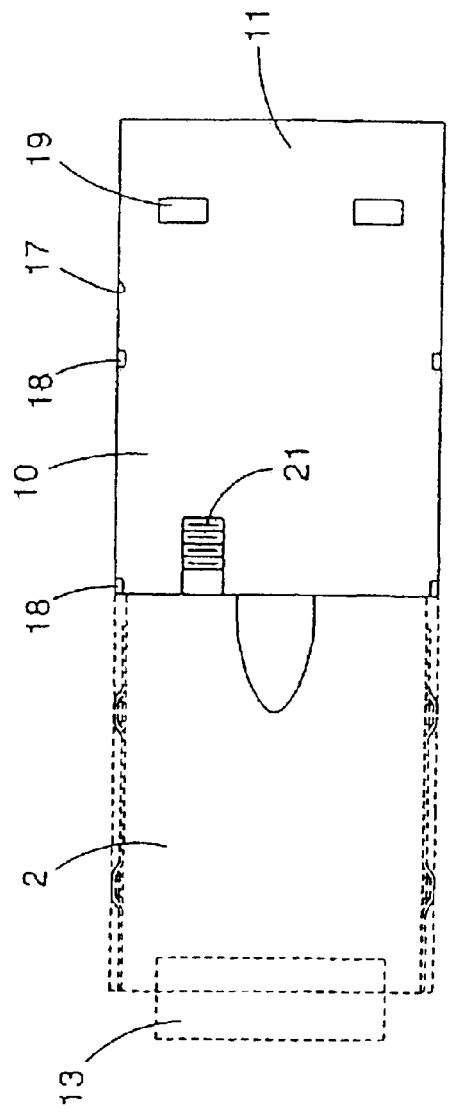
FIGS. 6 and 7 are schematic views showing the action of the extension box of the present invention.

Referring to FIGS. 4 and 6, there is shown the display being used as TV The extension box 2 is inserted into the insertion slot 12 from the guiding slot 10, and the connection section 20 of the extension box 2 is inserted to the inserting connection section 13. After that the aerial or TV cable is connected to the aerial connector 21.

Figure 7:
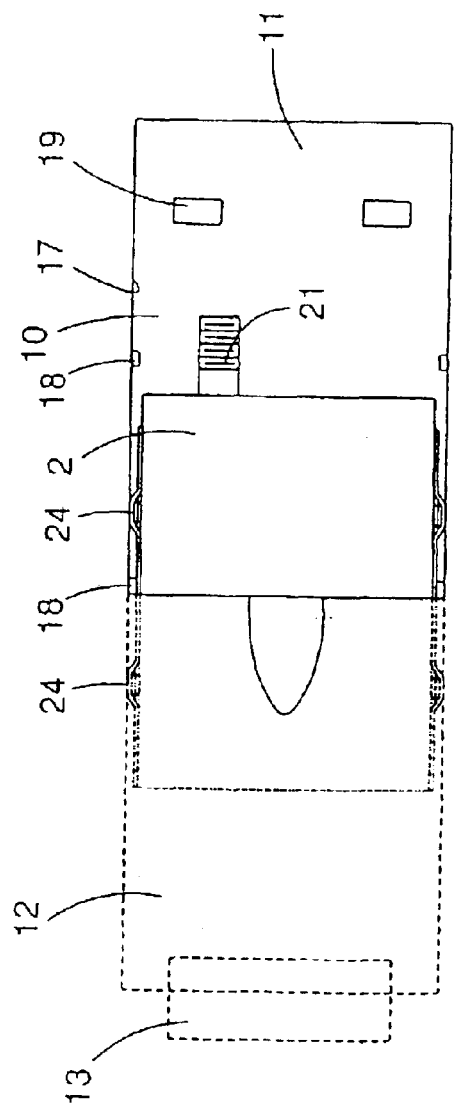
Figure 8:
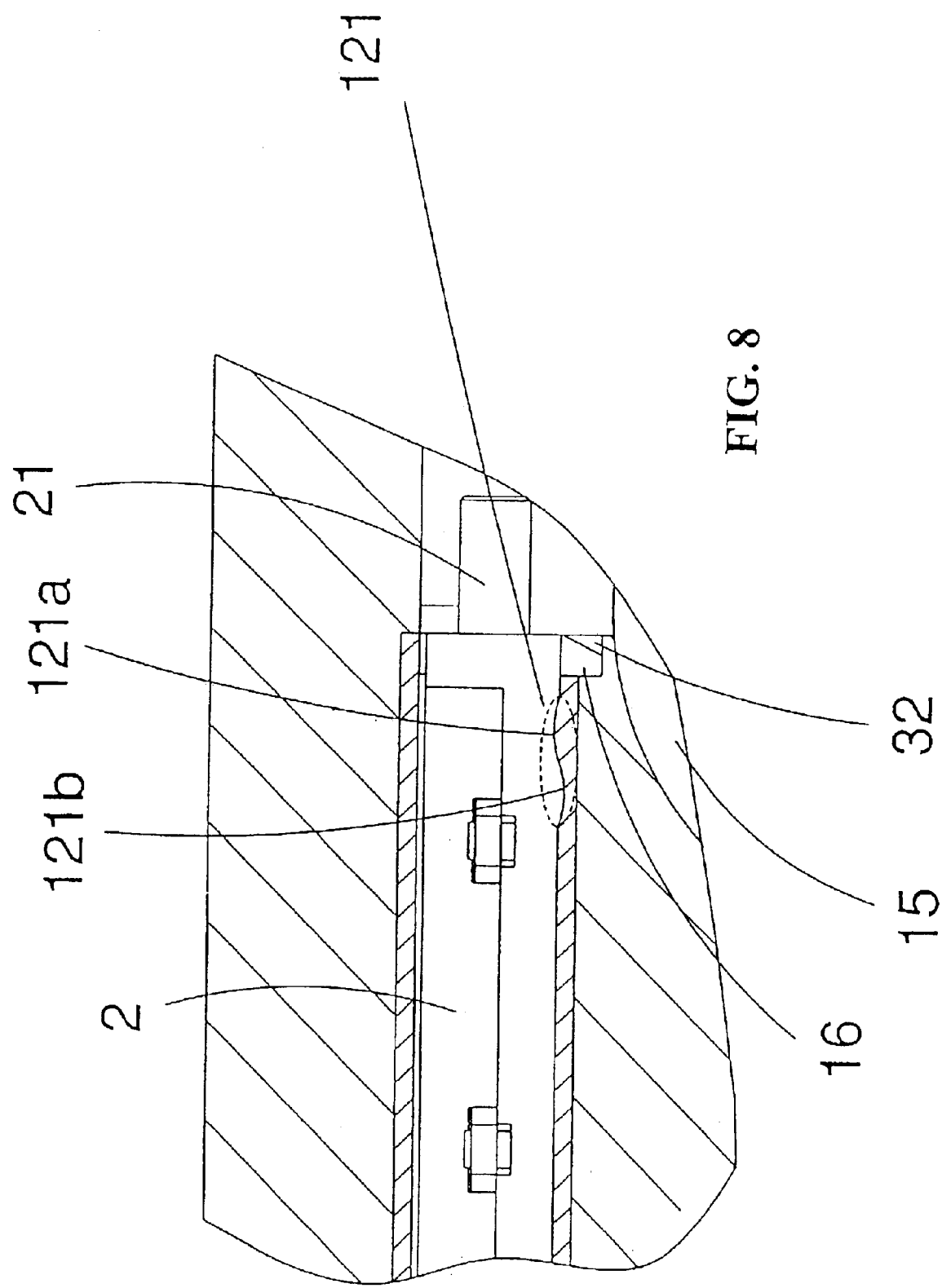
FIG. 8 is a partial sectional enlarged view of the present invention.

Referring to FIG. 7, when the display is used as computer, the connection section 20 of the extension box 2 is released from the inserting connection section 13 from the insertion slot 12, and the extension box 2 is moved within the guiding slot 10 to a position between two engaging sections 24 of the positioning rib 18 of the wall 17 of the slot. Thus, the restriction of the engaging slot 24 and the positioning rib 18 the connection section 20 of the extension box 2 and the inserting section 13 will not be in contact.

In accordance with the present invention, the advantages of the display extension structure are as follows:

(1) The extension box can be easily installed or dismantled. The sliding slot 10 at the back of the display facilitates the mounting of the extension box.

(2) The operating of the display structure is simple. The engaging section 24 and the positioning rib 18 provide a restriction to avoid in appropriate contact. Thus, the operation of the display structure is simple.

(3) The volume of the display is reduced. The extension box 2 is mounted by horizontal insertion into the insertion slot 12. Thus the volume of the display is greatly reduced.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A display extension structure comprising:

(a) a housing mounted at the rear side of the display;

(b) an insertion slot disposed on the housing, the bottom end of the insertion slot connected to a connection section and the other end of the insertion slot being formed into an opening;

(c) a positioning device including an apex region and a valley region; and (d) an extension box adapted within the insertion slot, one end of the extension box being a connection section, and the extension box being connected to the connection section by means of the positioning device and the bottom end of the insertion slot, the other end of the extension box being provided with an input terminal for external signals.

2. The display extension structure of claim 1, wherein the housing includes a sliding slot having one end being an opening, and the walls of the slot are provided with a plurality of positioning ribs spaced apart.

3. The display extension structure of claim 1, wherein the positioning device includes an apex region and a valley region which allows two stages of urging of the extension box.

4. The display extension structure of claim 1, wherein the extension box is a 2 mm thick anti-magnetic wave metallic box having a volume larger than that of the positioning device in the insertion slot so that the passed through positioning device can be urged or restored.

5. The display extension structure of claim 1, wherein the external housing of the extension box includes an upper housing and a lower housing mounted to each other, and an elastic engaging section includes a protruded plate and a bending plate and the protruded plate is a plate body formed from the side of the upper housing directly pushed outward to become an arch-shaped, and the protruded plate and the bending plate are stacked, and the bottom side face is mounted with a plurality of anti-sliding stripes, enhancing frictional force of sliding when the extension box is within the guiding slot.

6. The display extension structure of claim 1, wherein the housing is provided with a sliding slot, and a cover body is positioned on the top of the sliding slot, and one side of the cover body is provided with a plurality of protruded blocks for engagement with the engaging hole, and the other side of the cover body is a U-shaped fastening plate having a top end being exposed in the recess and the other side of the elastic fastener is an engaging block for engagement within the engaging slot.

* * * * *